(12) United States Patent
Carson et al.

(10) Patent No.: US 11,187,831 B2
(45) Date of Patent: Nov. 30, 2021

(54) SEMICONDUCTOR LENS OPTIMIZATION OF FABRICATION

(71) Applicant: Lumentum Operations LLC, San Jose, CA (US)

(72) Inventors: Richard F. Carson, Albuquerque, NM (US); John R. Joseph, Albuquerque, NM (US); Mial E. Warren, Albuquerque, NM (US); Thomas A. Wilcox, Rio Rancho, NM (US)

(73) Assignee: Lumentum Operations LLC, San Jose, CA (US)

( * ) Notice: Subject to any disclaimer, the term of this patent is extended or adjusted under 35 U.S.C. 154(b) by 137 days.

(21) Appl. No.: 15/898,048

(22) Filed: Feb. 15, 2018

(65) Prior Publication Data

US 2018/0172885 A1   Jun. 21, 2018

Related U.S. Application Data

(62) Division of application No. 15/133,094, filed on Apr. 19, 2016, now Pat. No. 9,927,558.

(51) Int. Cl.
*G02B 3/00* (2006.01)
*H01S 5/00* (2006.01)
(Continued)

(52) U.S. Cl.
CPC ............ *G02B 3/0012* (2013.01); *G02B 1/14* (2015.01); *G02B 3/0043* (2013.01);
(Continued)

(58) Field of Classification Search
CPC .. G02B 3/0012; G02B 3/0043; G02B 3/0056; G02B 3/0025; G02B 3/0037; G02B 1/14;
(Continued)

(56) References Cited

U.S. PATENT DOCUMENTS 5,316,640 A    5/1994  Wakabayashi et al.
7,679,828 B2 *  3/2010  Munro ............. B29D 11/00278
                                                        359/627
(Continued)

FOREIGN PATENT DOCUMENTS

CN        1576895 A     2/2005
CN      101473439 A     7/2009
(Continued)

OTHER PUBLICATIONS

European Patent Application No. 17786386.7; Extended Search Report; dated Nov. 18, 2019; 7 pages.
(Continued)

*Primary Examiner* — Charlee J. C. Bennett
(74) *Attorney, Agent, or Firm* — Harrity & Harrity, LLP

(57) ABSTRACT

Embodiments comprise a system created through fabricating a lens array through which lasers are emitted. The lens array may be fabricated in the semiconductor substrate used for fabricating the lasers or may be a separate substrate of other transparent material that would be aligned to the lasers. In some embodiments, more lenses may be produced than will eventually be used by the lasers. The inner portion of the substrate may be formed with the lenses that will be used for emitting lasers, and the outer portion of the substrate may be formed with lenses that will not be used for emitting lasers—rather, through etching these additional lenses, the inner lenses may be created with a higher quality.

20 Claims, 3 Drawing Sheets

(51) Int. Cl.
*H01J 37/32* (2006.01)
*G02B 7/00* (2021.01)
*G02B 1/14* (2015.01)
*H01S 5/42* (2006.01)
*B01J 8/00* (2006.01)

(52) U.S. Cl.
CPC ............ *G02B 3/0056* (2013.01); *G02B 7/005* (2013.01); *H01J 37/32009* (2013.01); *H01S 5/005* (2013.01); *H01S 5/423* (2013.01); *B01J 8/00* (2013.01); *B01J 2208/00008* (2013.01); *G02B 3/0018* (2013.01); *G02B 3/0025* (2013.01); *G02B 3/0037* (2013.01); *H01J 2237/10* (2013.01); *H01J 2237/334* (2013.01)

(58) Field of Classification Search
CPC ............... G02B 7/005; H01J 37/32009; H01J 2237/10; H01J 2237/334; H01S 5/005; H01S 5/423; B01J 8/00; B01J 2208/00008
USPC ............................ 118/728; 156/345.1–345.55
See application file for complete search history.

(56) References Cited

U.S. PATENT DOCUMENTS

| | | | |
|---|---|---|---|
| 8,021,903 B2 | 9/2011 | Chang et al. | |
| 8,390,931 B2 | 3/2013 | Boettiger et al. | |
| 9,746,369 B2 | 8/2017 | Shpunt et al. | |
| 9,927,558 B2 | 3/2018 | Carson et al. | |
| 2002/0034014 A1 | 3/2002 | Gretton et al. | |
| 2005/0003309 A1 | 1/2005 | Cho et al. | |
| 2006/0119950 A1 | 6/2006 | Boettiger et al. | |
| 2009/0068775 A1 | 3/2009 | Chang et al. | |
| 2009/0256228 A1 | 10/2009 | Boettiger et al. | |
| 2010/0165134 A1* | 7/2010 | Dowski, Jr. ............ G02B 7/022 348/218.1 |
| 2013/0206967 A1 | 8/2013 | Shpunt et al. | |
| 2013/0266326 A1* | 10/2013 | Joseph .................... H01S 5/423 398/130 |
| 2013/0272330 A1 | 10/2013 | Joseph et al. | |
| 2014/0152809 A1 | 6/2014 | Nimura | |
| 2015/0340841 A1* | 11/2015 | Joseph ................ H01S 5/04257 372/50.12 |
| 2016/0056187 A1 | 2/2016 | Lin | |

FOREIGN PATENT DOCUMENTS

| | | |
|---|---|---|
| CN | 101506715 A | 8/2009 |
| CN | 104160240 A | 11/2014 |
| CN | 105374830 A | 3/2016 |
| JP | H11-202314 A | 7/1999 |
| JP | 3251150 B2 | 1/2002 |
| TW | I319815 B | 1/2010 |
| WO | WO 2014/175901 A1 | 10/2014 |

OTHER PUBLICATIONS

International Patent Application No. PCT/US2017/027674; Int'l Search Report and the Written Opinion; dated Jul. 13, 2017; 19 pages.

* cited by examiner

SEMICONDUCTOR LENS OPTIMIZATION OF FABRICATION

CROSS REFERENCE TO RELATED APPLICATIONS

This application is a divisional of U.S. patent application Ser. No. 15/133,094, filed Apr. 19, 2016, the contents of which is incorporated herein by reference in its entirety.

BRIEF DESCRIPTION OF THE INVENTION

Embodiments comprise a system created through fabricating a lens array through which lasers are emitted. The lens array may be fabricated in the semiconductor substrate used for fabricating the lasers or may be a separate substrate of other transparent material that would be aligned to the lasers. In some embodiments, more lenses may be produced than will eventually be used by the lasers. The inner portion of the substrate may be etched with the lenses that will be used for emitting lasers, and the outer portion of the substrate may be etched with lenses that will not be used for emitting lasers—rather, through etching these additional lenses, the inner lenses may be created with a higher quality.

BACKGROUND

Lenses—optical devices that transmit and refract light—or arrays of lenses, may be fabricated on the back of a semiconductor laser substrate for back emitting VCSEL (Vertical Cavity Surface Emitting Lasers) or VECSELs VCSEL (Vertical (Extended or External) Cavity Surface Emitting Lasers) designs. A VCSEL is a type of semiconductor laser diode with laser beam emission perpendicular from the top surface. In contrast, conventional edge-emitting semiconductor lasers emit from surfaces formed by cleaving the individual chip out of a wafer. VECSELs then are a type of VCSELs that have been reconfigured to have the cavity extended outside of the wafer. In an alternative approach, the lens array may be fabricated separately, in a different material, such as glass or transparent polymer. The lens array may be configured to align, by mechanical means, to the lasers in an assembly or manufacturing process. Such fabrication of the lens arrays may generally be performed by transferring a pattern from photoresist into the surface of the substrate by etching. An etched lens may be characterized by its respective curvature or Radius of Curvature (ROC), and this curvature may be a significant aspect of the performance of the lens. An etched lens may also be a Fresnel or diffractive structure where the light is controlled by a pattern that produces a similar phase delay of the light as a conventional lens. In that case, a pattern from photoresist (or an electron beam resist, or a resist patterned by physical imprinting, or stamping) may also be transferred into the surface of the substrate material by etching.

DETAILED DESCRIPTION OF ILLUSTRATIVE EMBODIMENTS

Figure 1:
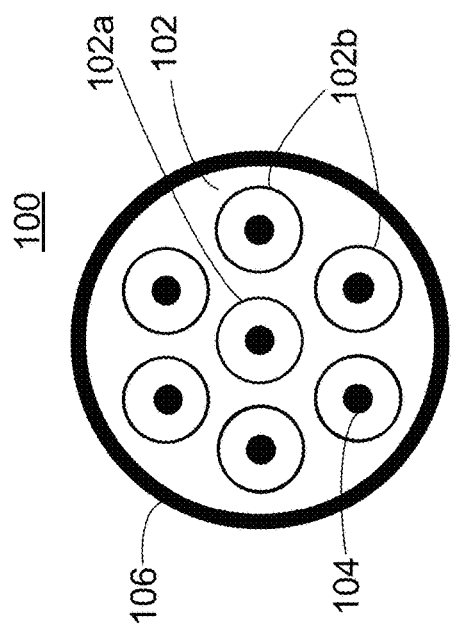
FIG. 1 illustrates an example embodiment of an etched array of lenses where functional lenses are aligned to the lasers.

Etching generally may be the process of using chemicals to fabricate a substrate to remove one or more layers, with parts of the substrate being unexposed to a particular etching iteration when being covered by a masking material that resists etching. The lens fabrication process requires the gradual etching away or erosion of a photoresist so that the shape of the photoresist structure is transferred into the substrate. The rate of this lens fabrication process does not consume the chemical reactive species in the etch process as fast as the slower etching process of the photoresist material. Thus, the ratio of the etching of the substrate material to the photoresist material ideally should be constant throughout the etching process. A problem with etching an array of lenses into a substrate is that doing so may cause a loading effect that produces different etch rates at different locations due to the ratio of areas of the etch material to the areas of the more slowly etched material or photoresist. This is because, if more area of the substrate is uncovered by photoresist for etching, the rate will slow down due to the lower availability of the chemical reactive species that is used for etching in that localized region. The availability of the chemical reactive species may be adjusted with complex gas flows and composition experiments, with electrical bias adjustments, or with a combination of these two techniques. However, the results of etching are, by nature, complex, and to de-convolve so many variables is a difficult problem to solve.

A solution to this problem may comprise producing more than enough lenses so that the lenses that are functional (i.e., light is directed through the lens) are conveniently positioned on the interior portion in an array and have the same ratio of the area of uncovered substrate material to the area of photoresist material across the array. This same ratio of the area of exposed substrate material to the area of non-etched photoresist material may be accomplished through these non-functional exterior lenses (i.e., light is not directed through the lenses), because these exterior lenses comprise etched material just like the functional lenses. Therefore, each functional lens may be surrounded by the same number of adjoining lenses (and these adjoining lenses may be other functional lenses or a combination of functional lenses and non-functional lenses). The distance between the center of any functional lens and the center of any adjacent lens (whether it be functional or non-functional lenses) may be the same. Likewise, the distance from the center of any lens and any adjacent lens may be the same, such that the distance between any two adjacent lens are the same, regardless of whether one lens is functional and the other is not, both lenses are functional or both lenses are non-functional. These interior lenses may be used for characterization of etch parameters, while the exterior lenses in the array may have a different ratio of etched area to non-etched or patterned areas.

Figure 4:
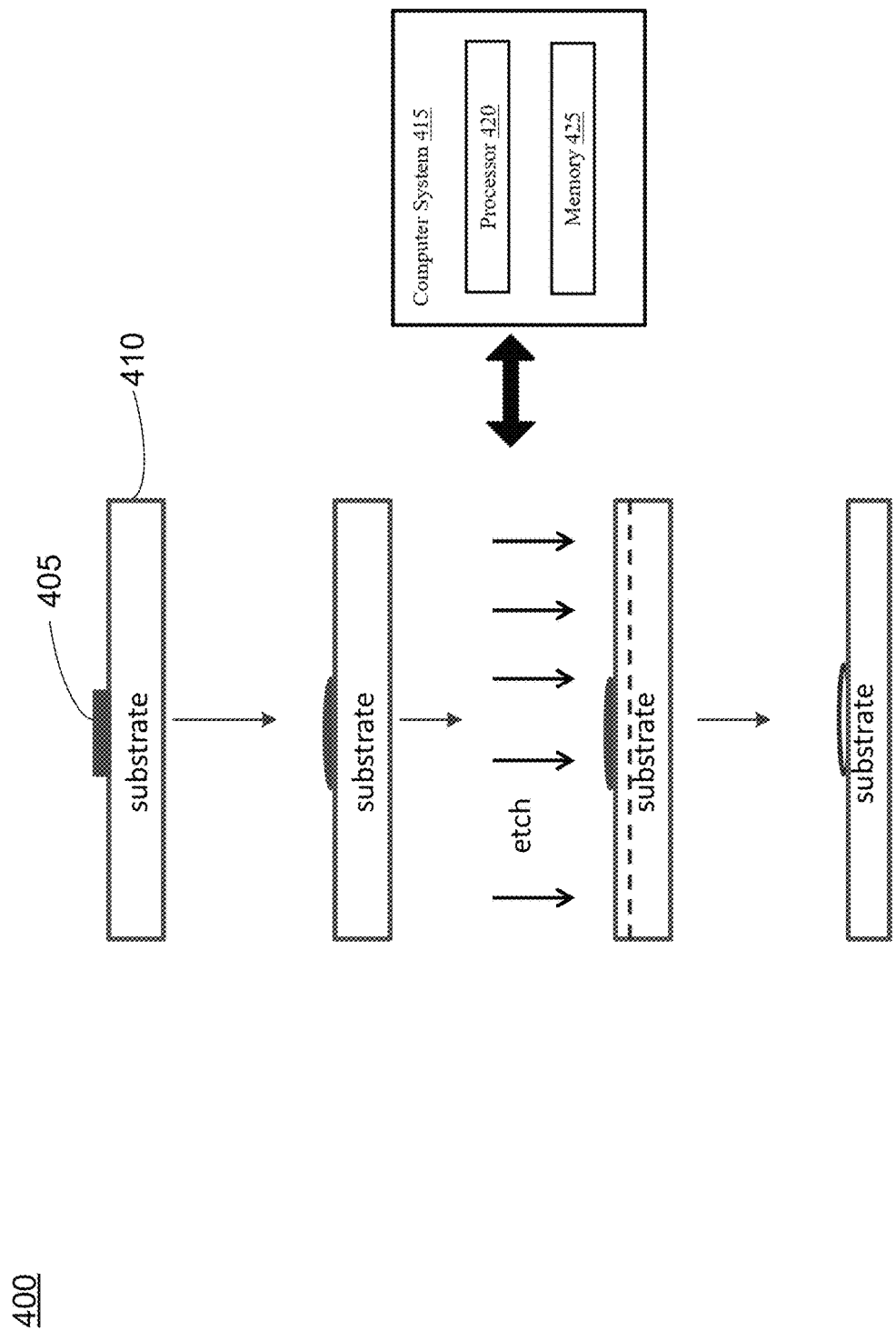
FIG. 4 illustrates an example embodiment of a method for transferring a pattern from photoresist into a substrate by etching.

As shown in FIG. 4, in some embodiments, the solution described above may be performed by a system 415. The system itself may generally include a processor 420 and one or more memories 425 containing a program including instructions, which, when executed on the processor 420 are configured to perform an operation for manufacturing lenses. For example, a computer system may be used to design the layout of the lenses and to direct the equipment manufacturing the lenses.

These lens arrays may be fabricated in a variety of processes to produce exterior and interior lenses, such as through wet etching, anisotropic wet etching, and plasma etching. A greyscale lithography process may also be used to produce the interior and exterior lenses. Interior functional lenses may be several lens periods back from a border of the substrate. The non-functional exterior lenses may be non-functional save for having a positional function in producing uniform interior lenses.

In some embodiments, a thick material may also be deposited on the substrate to serve as a protective height barrier so that the lenses do not get scratched if the substrate lands on its lens side.

FIG. 1 illustrates an example embodiment of an etched array of lenses 100 where functional lenses 102 extend to the edge of the substrate. Lens array 100 contains only functional lenses 102 (as opposed to non-functional lenses). These lenses may be considered to be functional as they are designed for the transmission of laser radiation. It may be observed that all the depicted lenses 102 are functional because each functional lens has a corresponding laser 104 that is on the opposite side of the substrate and aligned (or purposefully misaligned; see FIG. 2) to the lens. In this array, the lens 102a in the middle of the array 100 may be configured to align to the VCSEL, while the next ring of lenses 102b may be purposefully designed to have a smaller pitch than the lens 102a, which produces beams that uniformly diverge. In some embodiments, there may also be a deposited material 106 built or constructed on top of and around lens array 100 to prevent scratches on the lenses.

It may be appreciated that, in some embodiments, the etching process may cause lens 102a to have a different Radius of Curvature (ROC) or of varying dimension than the ROC of lenses 102b. This is because the ratio of uncovered substrate material to the more slowly etched photoresist material surrounding lens 102a and lenses 102b may differ. Lens 102a itself comprises photoresist material, and is surrounded by lenses 102b, which also comprise photoresist material. The material between and surrounding the lenses is unmasked substrate surface which may be etched aggressively from the start of the process. In contrast, lenses 102b comprise photoresist material, but may not be completely surrounded by other photoresist material. Where a lens in lenses 102b is adjoined by other lenses in lenses 102b or by lens 102a, that neighboring material is also slowly etched photoresist material. However, toward the outer edge of the substrate, lens 102b may not contain photoresist material. So, the loading effect may be different between lenses 102b and lens 102a. This means that the ratio of area of uncovered substrate material to area covered with photoresist differs between lenses in lenses 102b (where they are not surrounded by lenses comprising photoresist material) and lens 102a (which is surrounded by other lenses comprising photoresist material). In other words, since this ratio of uncovered substrate area to the area covered by photoresist lens patterns differs between lenses in 102b and in 102a, the lenses of 102b may have a different ROC than the ROC in lens 102a.

Figure 2:
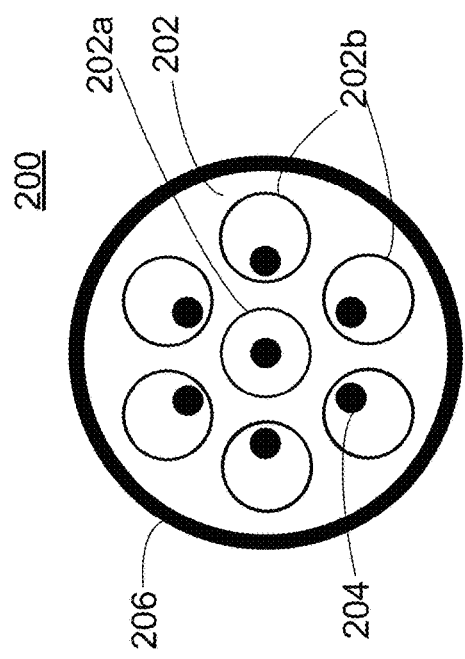
FIG. 2 illustrates an example embodiment of an etched array of lenses where functional lenses are purposely misaligned (offset) in relation to the lasers.

FIG. 2 illustrates another example embodiment of an etched array of lenses 200 where functional lenses 202 extend to the edge of the substrate. However, distinct from FIG. 1 where the depicted lenses 102 are functional because each depicted functional lens 102 is aligned with its corresponding laser 104, FIG. 2 illustrates, that all functional lenses 202b, excluding lens 202a, may be purposefully misaligned (offset) from each of their corresponding lasers 204. By positioning or locating the lenses 202b in an offset from each of their corresponding lasers 204, the beams emitting from the lasers may be conveniently directed to a desired convergence, divergence and/or to a specific direction.

Figure 3:
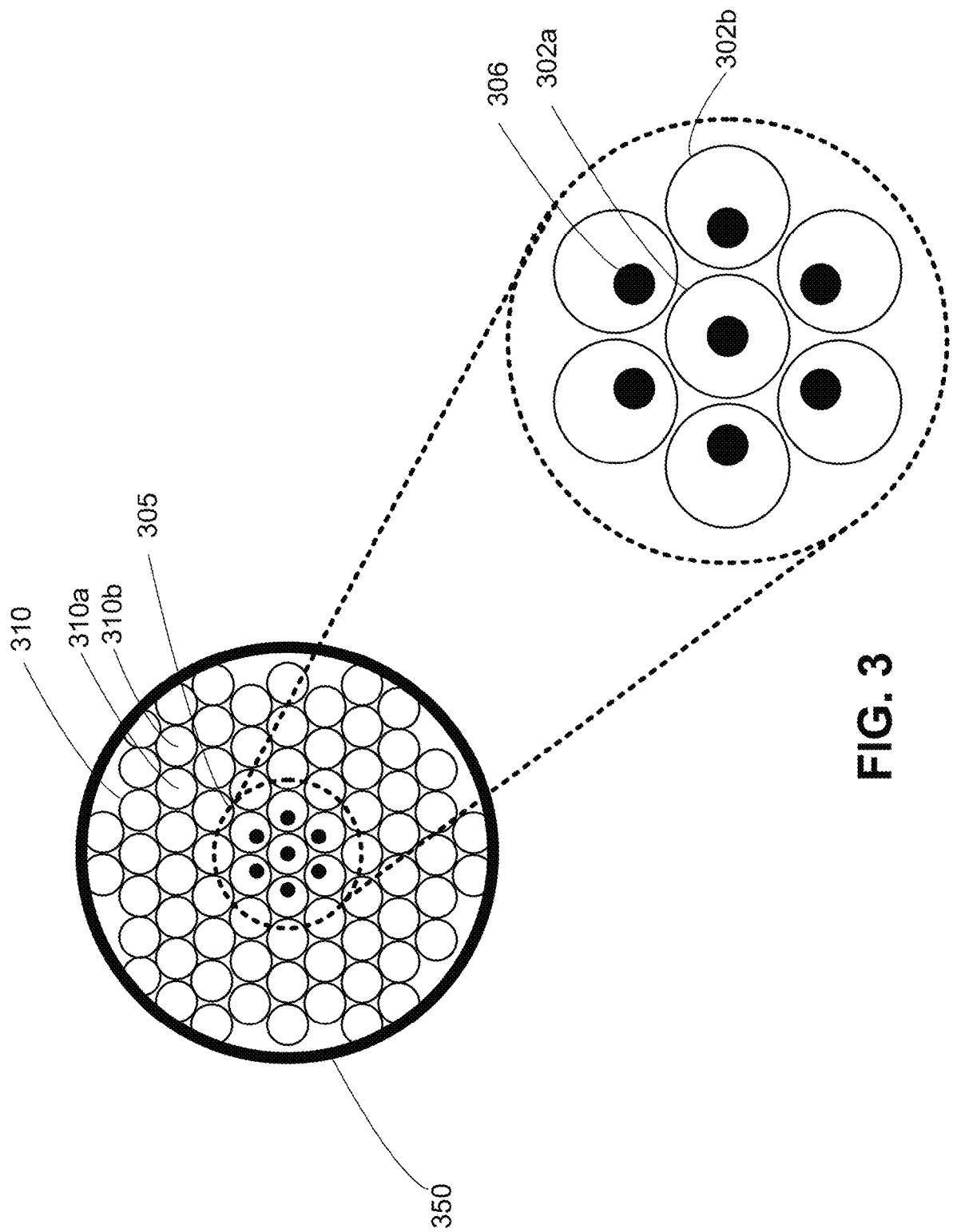
FIG. 3 illustrates an example embodiment of an etched array of lenses where functional lenses, shown in detail, are surrounded by exterior, non-function lenses.

FIG. 3 illustrates an example embodiment of an etched array of lenses 300 where functional lenses 305, the lenses fully inside the dashed line, are surrounded by exterior, non-functional lenses 310, the lenses under and outside of the dashed line. The functional lenses are further broken out in detail. In fabricating lenses in such a manner, as opposed to lens array 200 of FIG. 2, loading effects may be diminished, and more uniform lenses may also be created. While lens array 300 is depicted here as being substantially circular, it may be appreciated that there are embodiments that create a lens array in different shapes. FIG. 3 differs from FIG. 2 in that, in FIG. 3, there is a ring of exterior, non-functional lenses 310 that are etched into the substrate. So, here, lens array 300 contains both functional lenses 305, and non-functional lenses 310. The functional lenses 305 may be considered to be functional because each functional lens 305 has a corresponding laser 306 that is on the opposite side of the substrate and aligned (or purposefully misaligned) to the lens. In this array of lenses 300, the lens 302a in the middle of the array 300 is aligned to the VCSEL, while the next ring of lenses 302b may be purposefully designed to have a smaller pitch than the lens 302a, which produces beams that uniformly diverge, or a different alignment between the laser for lens 302a and the lasers for lenses 302b. Then, there are exterior, non-functional lenses 310 that are etched on the substrate to reduce loading effects on the functional lenses 305. There may also be a deposited material 350 built on top of and around lens array 300 to prevent scratches on the lenses.

Furthermore, as illustrated in FIG. 3, the distance between the center of each functional lens 305 and the center of the surrounding adjoining lenses (whether it be a functional lens 305 or non-functional lens 310) may be the same distance between the centers of any two adjacent lenses. For instance, the distance between the center of functional lens 302a and the center of adjacent functional lens 302b may be the same distance between the center of non-functional lens 310a and the center of adjacent non-functional lens 310b. Put another way, the distance from the center of any lens (functional or non-functional) to the center of an adjacent lens (functional or non-functional) is all the same.

In contrast to lens array 100 of FIG. 1 and lens array 200 of FIG. 2, where lenses 102b, 202b, 102a, and lens 202a experience different loading effects, here, all functional lenses 305 experience substantially similar loading effects, so all functional lenses 305 have substantially similar ROCs. These substantially similar loading effects are due, in part, to the presence of non-functional lenses 310, which surround the array of functional lenses 305. In contrast to the lenses of FIGS. 1 and 2, here, each functional lens is surrounded by the same number of other (functional or non-functional) lenses, so each functional lens experiences the same ratio of etched material to non-etched material. Since each functional lens of functional lenses 310 has the same ratio of rapidly etched material to slowly etched material around it, it experiences the same loading effects as the other functional lenses, so all functional lenses 305 are produced with substantially the same ROC.

This design of an array of lenses 300 or other optical surfaces may overcome etch limitations in order to allow interior lenses 305 in lens array 300 to be of higher uniformity for better functional performance when compared to exterior lenses 310 in lens array 300, which are non-functional save for having a positional function for producing uniform interior lenses 305. Additionally, this array of optical surfaces in lens array 300 may overcome etch limitations in order to allow interior lenses 305 in lens array 300 to be of higher uniformity for better functional performance as opposed to exterior (non-functional) lenses 310 in lens array 300, and other non-functional arrays of lenses that buffer functional lenses 305 from exterior lenses 310.

Additionally as noted above and as shown in FIG. 3, the functional lenses 305 within the lens array 300, excluding lens 302a, may be offset from their respective laser 306 alignments to direct beams in a specified direction. Combinations of misaligned beams and aligned beams may be functional and have a non-functional lens etched to reduce loading effects on functional lenses 305.

A thick deposition of material may be deposited around the circumference or over the lenses 305 (not depicted in FIG. 3, but depicted in FIGS. 1 and 2) and/or 310 (material 350), or a combination of each, so that a protective height is built up in order not to scratch lens 305 or 310.

FIG. 4 illustrates an example embodiment of a method of transferring a pattern from photoresist 405 into a substrate 410 by etching. The flow or process 400 in FIG. 4 depicts a photoresist structure 405 that may be melted onto the substrate 410. Once melted on the substrate 410 or utilizing a different technique known to those skilled in the art of transferring a photoresist onto the substrate 410, a rounded shape is formed on the substrate 410. This rounded shape on the substrate 410 may be exposed to an etch process. With an exposed rounded shape, the etching process may etch more rapidly and with a vertical directionality. The etching process may also be sensitive to many factors, including the amount of exposed substrate material around the photoresist. At the conclusion of the etching process, a certain shape may be fully transferred into the substrate 410. FIG. 4 illustrates an example embodiment of a single photoresist transferred onto the substrate 410; however, multiple or more than one photoresists may be transferred onto the substrate 410 at the same time.

Another embodiment includes fabrication of the lens shape directly into the photoresist by a process such as greyscale lithography. Those shapes may then be used as lenses. Alternatively, the pattern of shapes may also be etched into the substrate material.

In an embodiment, a method for manufacturing lenses comprises etching a layer of photoresist over a substrate to form a lens array with a plurality of lenses, wherein the lens array further comprises an inner portion with a first set of lenses and an outer portion with a second set of lenses, wherein the second set of lenses is positioned adjacent to and surrounds the first set of lenses, wherein each lens in the first set of lenses is surrounded by a same number of lenses of either the first set of lenses or the second set of lenses, and positioning each laser among a plurality of lasers to correspond with each lens in the first set of lenses and positioning no laser to correspond with any of the lenses in the second set of lenses. In the embodiment, wherein etching the layer of photoresist is accomplished by at least one of: a wet etching process, an anisotropic wet etching process, a plasma etching process, and a dry etching process. In the embodiment, wherein etching a layer includes transferring a pattern for the lens array from photoresist into the substrate. In the embodiment, wherein the lens array is circular in configuration. In the embodiment, wherein the plurality of lasers are positioned on the opposite side of the substrate from the lens array and wherein each laser is configured to emit light into each lens in the first set of lenses. In the embodiment, wherein a first laser is aligned to the center of a first lens from the first set of lenses and a second laser is aligned to be off-center of a second lens from the first set of lenses. In the embodiment, wherein the substrate is deposited with a thick material to serve as a protective height barrier and prevent scratches. In the embodiment, wherein each lens of the first set of lenses comprises a substantially similar Radius of Curvatures (ROCs) and wherein each lens of the first set of lenses is configured to be a length of several lenses from a border of the substrate. In the embodiment, wherein a distance from a center of any lens among the first set of lenses or the second set of lenses and the center of any adjacent lens is the same. In the embodiment, wherein a first lens in the second set of lenses comprises a smaller pitch than a second lens in the second set of lenses.

In an embodiment, a system for manufacturing lenses comprises a processor; and one or memories in communication with the processor when the system is in operation, the one or more memories having stored thereon instructions that upon execution by the processor at least cause the system to form a lens array with a plurality of lenses, wherein the lens array further comprises an inner portion with a first set of lenses and an outer portion with a second set of lenses, wherein the second set of lenses is positioned adjacent and surrounds the first set of lenses, wherein each lens in the first set of lenses is surrounded by a same number of lenses of either the first set of lenses or the second set of lenses, and position each laser among a plurality of lasers to correspond with each lens in the first set of lenses and position no laser to correspond with any of the lenses in the second set of lenses. In the embodiment, wherein the instructions that cause the system to form a lens array cause the system to etch a layer of photoresist over a substrate to form the lens array, wherein the etch is accomplished by at least one of: a wet etching process, an anisotropic wet etching process, a plasma etching process, and a dry etching process. In the embodiment, wherein the instructions that cause the system to etch the layer to form the lens array cause the system to transfer a pattern from photoresist into the substrate. In the embodiment, wherein the lens array is circular in configuration. In the embodiment, wherein the plurality of lasers are positioned on the opposite side of the substrate from the lens array and wherein each laser is configured to emit light into each lens in the first set of lenses. In the embodiment, wherein a first laser is aligned to the center of a first lens from the first set of lenses and a second laser is aligned to be off-center of a second lens from the first set of lenses. In the embodiment, wherein the substrate is deposited with a thick material to serve as a protective height barrier and prevent scratches. In the embodiment, wherein each lens of the first set of lenses comprises a substantially similar Radius of Curvatures (ROCs) and wherein each lens of the first set of lenses is configured to be a length of several lenses from a border of the substrate. In the embodiment, wherein a distance from a center of any lens among the first set of lenses or the second set of lenses and the center of any adjacent lens is the same. In the embodiment, wherein a first lens in the second set of lenses comprises a smaller pitch than a second lens in the second set of lenses. In the embodiment, wherein the instruction that cause the system to form the lens array control a greyscale photolithography process. In the embodiment, wherein the instructions that cause the system to form the lens array cause the system to transfer a pattern of lens shapes to the substrate.

In an embodiment, a method for manufacturing lenses comprises forming a lens array with a plurality of lenses, wherein the lens array further comprises an inner portion with a first set of lenses and an outer portion with a second set of lenses, wherein the second set of lenses is positioned adjacent and surrounds the first set of lenses, wherein each lens in the first set of lenses is surrounded by a same number of lenses of either the first set of lenses or the second set of lenses, and positioning each laser among a plurality of lasers to correspond with each lens in the first set of lenses and positioning no laser to correspond with any of the lenses in the second set of lenses. In the embodiment, wherein forming the lens array is accomplished by greyscale photolithography. In the embodiment, wherein forming the lens array comprises transferring a pattern of lens shapes to the substrate. In the embodiment, wherein transferring the pattern of lens shapes includes etching a layer of photoresist and the substrate. In the embodiment, wherein etching a layer of photoresist includes at least one of: a wet etching process, an anisotropic wet etching process, a plasma etching process, and a dry etching process. In the embodiment, wherein the lens array is circular in configuration. In the embodiment, wherein the plurality of lasers are positioned on the opposite side of the substrate from the lens array and each laser is configured to emit light into each lens in the first set of lenses. In the embodiment, wherein a first laser is aligned to the center of a first lens from the first set of lenses and a second laser is aligned to be off-center of a second lens from the first set of lenses. In the embodiment, wherein the substrate is deposited with a thick material to serve as a protective height barrier and prevent scratches. In the embodiment, wherein each lens of the first set of lenses comprises substantially similar Radius of Curvatures (ROCs) and wherein each lens of the first set of lenses are configured to be a length of several lenses from a border of the substrate. In the embodiment, wherein a distance from a center of any lens among the first set of lenses or the second set of lenses and the center of any adjacent lens is the same. In the embodiment, wherein a first lens in the second set of lenses comprises a smaller pitch than a second lens in the second set of lenses.

While the present invention has been illustrated and described herein in terms of a preferred embodiment and alternatives, it is to be understood that the techniques described herein can have a multitude of additional uses and applications. Accordingly, the invention should not be limited to just the particular description and various drawing figures contained in this specification that merely illustrate a preferred embodiment and application of the principles of the invention.

What is claimed:

1. A system for manufacturing lenses, the system comprising:
a processor; and
one or more memories in communication with the processor, the one or more memories having stored thereon instructions that, upon execution by the processor, at least cause lens manufacturing equipment to:
form a lens array with a plurality of lenses, wherein the lens array further comprises an inner portion with a first set of lenses and an outer portion with a second set of lenses, wherein the second set of lenses is positioned adjacent to and surrounds the first set of lenses, wherein the first set of lenses is surrounded by lenses of either the first set of lenses or the second set of lenses; and
physically position each laser among a plurality of lasers to align or misalign with a respective lens in the first set of lenses, such that respective beams of the plurality of lasers are incident on respective lenses in the first set of lenses, and do not physically position any laser to align or misalign with any of the lenses in the second set of lenses.

2. The system of claim 1, wherein the instructions that cause the lens manufacturing equipment to form a lens array cause the lens manufacturing equipment to etch a layer of photoresist over a substrate to form the lens array, wherein the etch is accomplished by at least one of: a wet etching process, an anisotropic wet etching process, a plasma etching process, and a dry etching process.

3. The system of claim 2, wherein the instructions that cause the lens manufacturing equipment to etch the layer to form the lens array cause the lens manufacturing equipment to transfer a pattern from photoresist into the substrate.

4. The system of claim 1, wherein the lens array is circular in configuration.

5. The system of claim 1, wherein the plurality of lasers are positioned on the opposite side of a substrate from the lens array and wherein each laser is configured to emit light into each lens in the first set of lenses.

6. The system of claim 5, wherein a first laser, of the plurality of lasers, is aligned to the center of a first lens from the first set of lenses and a second laser, of the plurality of lasers, is aligned to be off-center of a second lens from the first set of lenses.

7. The system of claim 1, wherein a substrate is deposited with a thick material to serve as a protective height barrier and prevent scratches.

8. The system of claim 1, wherein each lens of the first set of lenses comprises a substantially similar Radius of Curvatures (ROCs) and wherein each lens of the first set of lenses is configured to be a length of at least two lenses from a border of a substrate.

9. The system of claim 1, wherein a distance from a center of any lens among the first set of lenses or the second set of lenses and the center of any adjacent lens is the same.

10. The system of claim 1, wherein a first lens in the first set of lenses comprises a smaller pitch than a second lens in the first set of lenses.

11. The system of claim 1, wherein the instruction that cause the lens manufacturing equipment to form the lens array control a greyscale photolithography process.

12. The system of claim 11, wherein the instructions that cause the lens manufacturing equipment to form the lens array cause the lens manufacturing equipment to transfer a pattern of lens shapes to a substrate.

13. A system for manufacturing lenses, the system comprising:
a processor; and
one or more memories in communication with the processor, the one or more memories having stored thereon instructions that, upon execution by the processor, at least cause lens manufacturing equipment to:
form a lens array with a plurality of lenses, wherein the lens array further comprises an inner portion with a first set of lenses and an outer portion with a second set of lenses, wherein the second set of lenses is positioned adjacent to and surrounds the first set of lenses, wherein the first set of lenses is surrounded by lenses of either the first set of lenses or the second set of lenses, wherein each lens in the first set of lenses has a substantially similar first radius of curvature, and wherein each lens in the second set of lenses having a second radius of curvature that is different from the first radius of curvature; and position each laser among a plurality of lasers to align or misalign with a respective lens in the first set of lenses, such that respective beams of the plurality of lasers are incident on respective lenses in the first set of lenses, and do not position any laser to align or misalign with any of the lenses in the second set of lenses.

14. The system of claim 13, wherein the instructions that cause the lens manufacturing equipment to form a lens array cause the lens manufacturing equipment to etch a layer of photoresist over a substrate to form the lens array, wherein the etch is accomplished by at least one of: a wet etching process, an anisotropic wet etching process, a plasma etching process, and a dry etching process.

15. The system of claim 14, wherein the instructions that cause the lens manufacturing equipment to etch the layer to form the lens array cause the lens manufacturing equipment to transfer a pattern from photoresist into the substrate.

16. The system of claim 13, wherein the lens array is circular in configuration.

17. The system of claim 13, wherein the plurality of lasers are positioned on the opposite side of a substrate from the lens array and wherein each laser is configured to emit light into each lens in the first set of lenses.

18. The system of claim 17, wherein a first laser, of the plurality of lasers, is aligned to the center of a first lens from the first set of lenses and a second laser, of the plurality of lasers, is aligned to be off-center of a second lens from the first set of lenses.

19. The system of claim 13, wherein a substrate is deposited with a thick material to serve as a protective height barrier and prevent scratches.

20. The system of claim 13, wherein a first lens in the first set of lenses comprises a smaller pitch than a second lens in the first set of lenses.

* * * * *